United States Patent
Araki

(10) Patent No.: US 9,257,976 B2
(45) Date of Patent: Feb. 9, 2016

(54) SEMICONDUCTOR DEVICE WITH TOUCH SENSOR CIRCUIT

(71) Applicant: RENESAS ELECTRONICS CORPORATION, Kawasaki-shi, Kanagawa (JP)

(72) Inventor: Masahiro Araki, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/540,981

(22) Filed: Nov. 13, 2014

(65) Prior Publication Data

US 2015/0145578 A1    May 28, 2015

(30) Foreign Application Priority Data

Nov. 26, 2013 (JP) .................. 2013-244073

(51) Int. Cl.
*H03K 5/135* (2006.01)
(52) U.S. Cl.
CPC ...................... *H03K 5/135* (2013.01)
(58) Field of Classification Search
USPC ................. 327/233–234, 241, 379, 384, 291
See application file for complete search history.

(56) References Cited

U.S. PATENT DOCUMENTS

| 7,312,616 | B2 | 12/2007 | Snyder |
| 8,089,289 | B1 | 1/2012 | Kremin et al. |
| 8,854,024 | B2 * | 10/2014 | Teh ..................... H02M 3/1588 |
| | | | 323/282 |

FOREIGN PATENT DOCUMENTS

JP    2008-199408 A    8/2008

* cited by examiner

*Primary Examiner* — An Luu
(74) *Attorney, Agent, or Firm* — McDermott Will & Emery LLP

(57) ABSTRACT

A semiconductor device includes a terminal to which a touch electrode may be coupled; a source voltage drop circuit generating a constant voltage; a phase shift circuit generating a phase shifted clock in response to a first clock and a phase control signal; and a switching circuit to which the constant voltage is supplied. The switching circuit generates drive pulses for applying the constant voltage to the terminal in response to the phase shifted clock. The phase shift circuit varies the phase of the drive pulses based on the phase control signal.

5 Claims, 8 Drawing Sheets

SEMICONDUCTOR DEVICE WITH TOUCH SENSOR CIRCUIT

CROSS-REFERENCE TO RELATED APPLICATIONS

The disclosure of Japanese Patent Application No. 2013-244073 filed on Nov. 26, 2013 including the specification, drawings and abstract is incorporated herein by reference in its entirety.

BACKGROUND

The present invention relates to a semiconductor device. More particularly, the invention relates to a semiconductor equipped with an electrostatic capacitance type touch sensor circuit.

In the technical field of touch keys and touch screens, electrostatic capacitance type touch sensor circuits have been widely adopted. U.S. Pat. No. 8,089,289 discloses a structure in which a sigma delta modulation circuit modulates the signal output from a switching capacity circuit into a digital signal. U.S. Pat. No. 7,312,616 discloses a structure in which a comparator compares a reference voltage with the terminal voltage of a device-under-test capacitor charged and discharged repeatedly at a predetermined frequency so that the value of the device-under-test capacitor may be measured. Japanese Unexamined Patent Publication No. 2008-199408 discloses a structure including an oscillation unit of which the frequency varies depending on an operation unit getting touched or not touched so that a frequency change in the frequency signal output from the oscillation unit may be detected.

SUMMARY

As disclosed in the above-cited patent literature, techniques have been generalized to measure the value of the capacitor by having a comparator compare the reference voltage with a detecting voltage generated on the basis of periodical charging and discharging currents of the capacitor in question. The comparator is a circuit that determines a minute voltage difference between the detecting voltage and the reference voltage and converts the result of the determination into a digital signal. If noise is superimposed on a system that includes a sigma delta modulation circuit, the noise affecting the minute voltage difference can incur erroneous determination by the comparator. Because the sigma delta modulation circuit is configured to sample the comparator output using a clock, a discrepancy in the sampled result stemming from the noise appears as an offset to the comparator input and may trigger a decline in the accuracy of measurement.

The noises that can affect the operation of the sigma delta modulation circuit adopted in the electrostatic capacitance type touch sensor circuit include the noise applied to touch electrodes via the human body in addition to the noise inside the system that incorporates the sigma delta modulation circuit in question, all these noises being a potential cause of the erroneous determination. In the environment where an electronic device incorporating the touch keys is used, there are diverse electromagnetic waves serving for wireless communication and those for the possible cause of EMI (electromagnetic interference). The human body behaves as an antenna capturing such electromagnetic waves. When a person receiving electromagnetic waves comes into contact with a touch electrode, noise is superimposed on the touch electrode and can trigger erroneous determination by the touch sensor circuit.

According to one embodiment of the present invention, there is provided a semiconductor device including: a terminal to which a touch electrode may be coupled; a source voltage drop circuit which generates a constant voltage; a phase shift circuit which generates a phase shifted clock in response to a first clock and a phase control signal; and a switching circuit to which the constant voltage is supplied. The switching circuit generates a drive pulse for applying the constant voltage to the terminal in response to the phase shifted clock. The phase shift circuit varies the phase of the drive pulse based on the phase control signal.

The above-outlined embodiment of the present invention offers a semiconductor device that eliminates the effects of the noise superimposed on the touch electrode via the human body and thereby improves the accuracy of touch detection.

DETAILED DESCRIPTION

Figure 1:
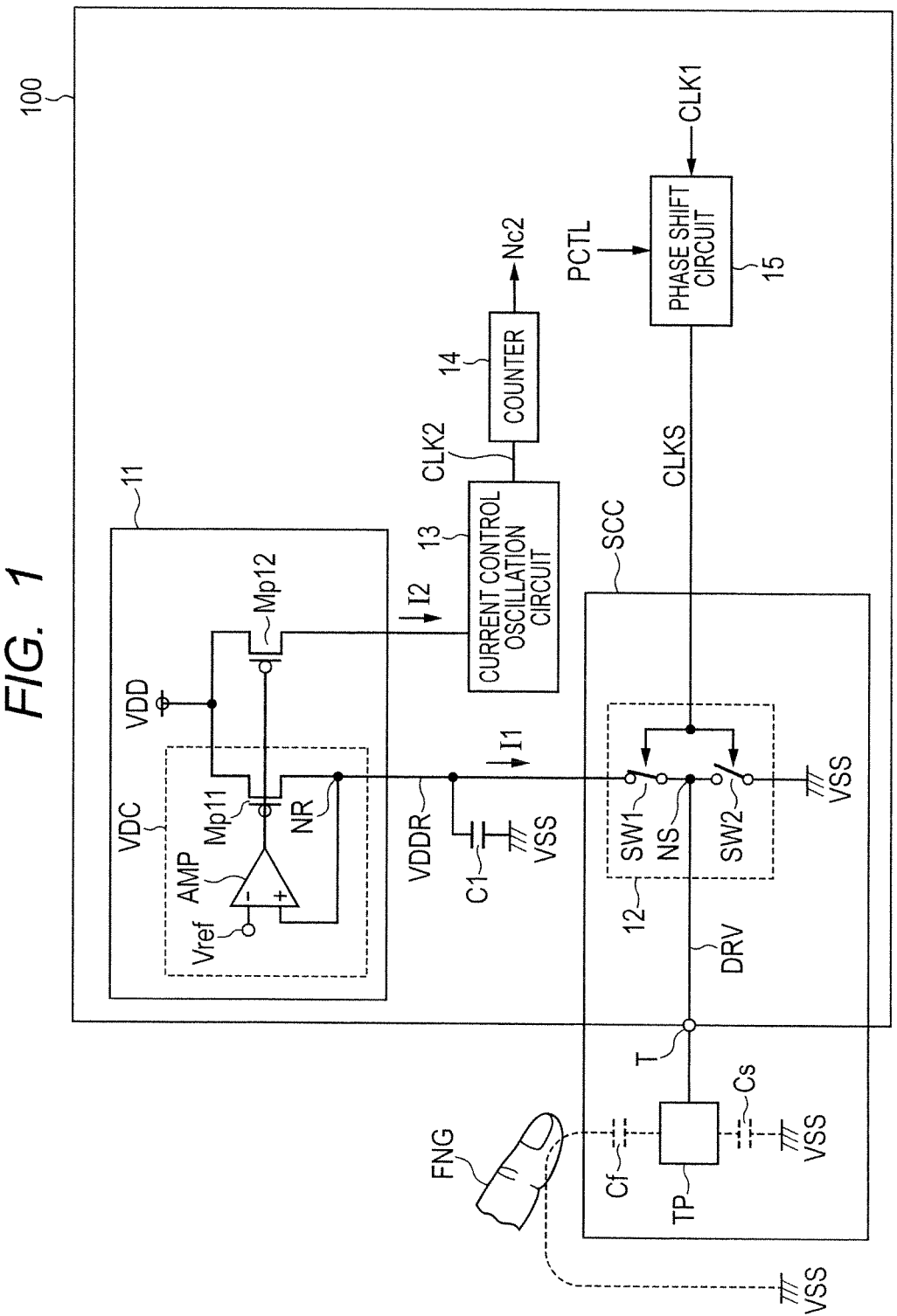
FIG. 1 is a block structure diagram of a semiconductor device as a first embodiment of the present invention.

Some preferred embodiments of the present invention will now be described with reference to the accompanying drawings. In the ensuing description of the embodiments, the quantity or volume of any entity that may be mentioned does not limit the entity in question in quantity or in volume unless otherwise noted. Also in the ensuing description and throughout the drawings, like reference characters or reference numerals designate like or corresponding parts, and their explanations will not be repeated where redundant.

First Embodiment

FIG. 1 is a block structure diagram of a semiconductor device 100 as the first embodiment of the present invention.

The semiconductor device 100 is equipped with an electrostatic capacitance type touch sensor circuit suitable for self-capacity touch keys. The touch sensor circuit incorporated in the semiconductor device 100 includes a current mirror circuit 11, a switching circuit 12, a current control oscillation circuit 13, a counter 14, a phase shift circuit 15, a capacitor C1, and a terminal T. The terminal T is coupled to a touch electrode TP equipped with self-capacity detection type touch keys (not shown). The touch electrode TP and the switching circuit 12 combine to form a switched capacitor circuit SCC.

(Structure of the Current Mirror Circuit 11)

The current mirror circuit 11 includes a source voltage drop circuit VDC and a p-type transistor Mp12. The source voltage drop circuit VDC drops the source voltage VDD to generate in a node NR a voltage VDDR that is maintained at a desired voltage value. The capacitor C1 is coupled to the node NR so as to suppress the fluctuations in the voltage VDDR.

The source voltage drop circuit VDC has a p-type transistor Mp11 and an amplifier AMP. The source voltage VDD is applied to the source of the p-type transistor Mp11, and the drain of the transistor Mp11 is coupled to the node NR. A reference voltage Vref is applied to one input terminal of the amplifier AMP, and the drain voltage of the p-type transistor Mp11 is applied to the other input terminal of the amplifier AMP by way of the node NR. The amplifier AMP controls the gate voltage of the p-type transistor Mp11 in such a manner that the drain voltage of the p-type transistor Mp11 becomes equal to the reference voltage Vref. This causes the voltage VDDR to be generated in the node NR.

The source voltage VDD is applied to the source of the p-type transistor Mp12, and the gate of the p-type transistor Mp12 is coupled to the gate of the p-type transistor Mp11. That is, the p-type transistors Mp11 and Mp12 form the current mirror circuit 11. The current drive capability (transistor size) of the p-type transistor Mp11 as part of the source voltage drop circuit VDC is set in such a manner as to supply an output current I1 necessary for the switched capacitor circuit SCC, to be discussed later. The current drive capability of the p-type transistor Mp12 is set to supply an output current I2 necessary for the current control oscillation circuit 13.

(Structure and Operation of the Switched Capacitor Circuit SCC)

The switching circuit 12 has switches SW1 and SW2. One end of the switch SW1 is coupled to the node NR that outputs the voltage VDDR, and the other end of the switch SW1 is coupled to a node NS. One end of the switch SW2 is coupled to the other end of the switch SW1 via the node NS, and a source voltage VSS is applied to the other end of the switch SW2. The conduction states of the switches SW1 and SW2 change in complementary fashion in response to a phase shifted clock CLKS. The node NS of the switching circuit 12 is coupled to the terminal T.

While the phase shifted clock CLKS is being at the Low level, the switch SW1 applies to the terminal T the voltage VDDR output from the source voltage drop circuit VDC. While the phase shifted clock CLKS is being at the High level, the switch SW2 applies the source voltage VSS to the terminal T. As can be understood from the logic level change of the phase shifted clock CLKS and the complementary change of the conduction states of the switches SW1 and SW2 (open and closed states), the switching circuit 12 performs the same operation as that of a CMOS inverter circuit. The switching circuit 12 generates a drive pulse DRV by inverting the logic level of the phase shifted clock CLKS, and outputs the generated drive pulse DRV to the terminal T.

The terminal T is coupled to the touch electrode TP attached to the self-capacity detection type touch keys (not shown). The touch electrode TP acts as the electrode for one of two parasitic capacitances Cs and Cf. The other electrode for the parasitic capacitance Cs is provided by a ground wire or like part of a printed circuit board (not shown) formed in the vicinity of the touch electrode TP. The other electrode for the parasitic capacitance Cf is provided by a finger FNG and the human body (not shown). The voltages of the other electrodes for the parasitic capacitances Cs and Cf are set to a ground voltage via the ground wire, finger FNG or the like. The value of the parasitic capacitance Cf becomes greater the shorter the distance between the touch electrode TP and the finger FNG.

The switching circuit 12 and touch electrode TP make up the switched capacitor circuit SCC. In response to the phase shifted clock CLKS, the switching circuit 12 charges and discharges the parasitic capacitances Cs and Cf formed in the touch electrode TP. While the phase shifted clock CLKS is being at the Low level, the switching circuit 12 applies the voltage VDDR to the touch electrode TP via the terminal T to charge the parasitic capacitances Cs and Cf. While the phase shifted clock CLKS is being at the High level, the switching circuit 12 applies the source voltage VSS to the touch electrode TP via the terminal T to discharge the parasitic capacitances Cs and Cf.

If it is assumed that fcs represents the frequency of the phase shifted clock CLKS and C denotes the capacity of the touch electrode TP, the switched capacitor circuit SCC may be considered an equivalent resistance R obtained with the following expressions:

$$R = 2/(fcs*C) \quad (1)$$

$$C = Cs + Cf \quad (2)$$

where the symbols "/" and "*" are a division sign and a multiplication sign, respectively. The source voltage drop circuit VDC supplies the switched capacitor circuit SCC with the output current I1 obtained by dividing the value of the voltage VDDR by the value of the equivalent resistance R.

As can be understood from the expressions (1) and (2) above, the equivalent resistance R of the switched capacitor circuit SCC formed by the switching circuit 12 and touch electrode TP varies depending on the distance between the finger FNG and the touch electrode TP. Thus when the touch electrode TP is touched with the finger FNG (this state may be referred to as "at the time of touch" or "in the touch state" hereunder), an increase in the value of the parasitic capacitance Cf triggers a drop in the value of the equivalent resistance R and raises the value of the output current I1 output from the source voltage drop circuit VDC. Conversely, when the finger FNG is detached from the touch electrode TP (this state may be referred to as "at the time of detaching" or "in the detached state" hereunder), a decrease in the value of the equivalent resistance R triggers an increase in the value of the equivalent resistance R and a decrease in the output current I1. Incidentally, it should be reaffirmed that "touching the touch electrode TP with the finger FNG" means placing the finger FNG onto an insulating film (not shown) above the touch electrode TP.

(Structures of the Current Control Oscillation Circuit 13, Counter 14, and Phase Shift Circuit 15)

The current control oscillation circuit 13 generates a second clock CLK2 of which the frequency fc2 varies with the value of the output current I2 from the current mirror circuit 11. Specifically, the current control oscillation circuit 13 is made up of a ring oscillator and a buffer circuit, the ring oscillator being formed by a predetermined number of inverter circuits coupled in a ring shape, each of the inverter circuits having its delay time varied in response to the value of the output current I2, the buffer circuit amplifying the output of the inverter circuit in the last stage of the ring oscillator to generate the second clock CLK2. The counter 14 counts the number of clock pulses in the second clock CLK2 over a predetermined counting period and outputs the result as a count value Nc2.

When the value of the output current I2 increases, the delay times of the above-mentioned inverter circuits decrease and the value of the frequency fc2 of the clock CLK2 rises. Conversely, when the value of the output current I2 decreases, the delay times of the inverter circuits increase and the value of the frequency fc2 drops. While the finger FNG is touching the touch electrode TP (at the time of touch), the value of the output current I2 output from the current mirror circuit 11 increases. While the finger FNG is being detached from the touch electrode TP (at the time of detaching), the value of the output current I2 drops. The variations in the value of the output current I2 are dependent on the changes in the parasitic capacitance Cf of the touch electrode TP. Thus when a change in the count value Nc2 over the predetermined counting period is detected and compared with a predetermined reference count value, it is possible to determine whether the finger FNG is touching or not touching the touch electrode TP.

The phase shift circuit 15 generates the phase shifted clock CLKS based on a first clock CLK1 and a phase control signal PCTL. Changing the logic level of the phase control signal PCTL causes the first clock CLK1 to be shifted by 180 degrees in phase.

Figure 2:
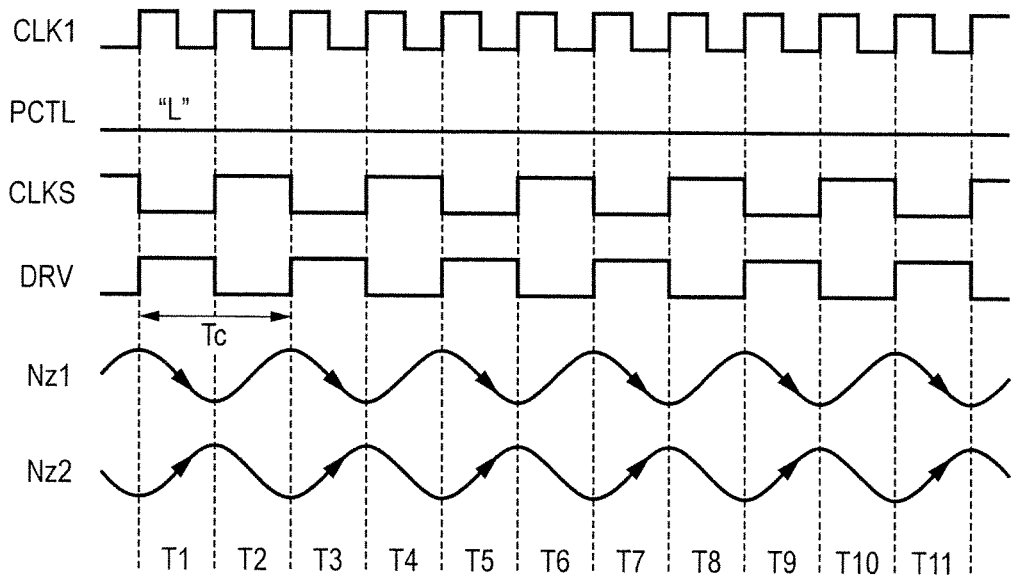
FIG. 2 is a timing chart explaining how a switching circuit operates when a phase shift circuit is deactivated in the semiconductor device of the first embodiment.
Figure 3:
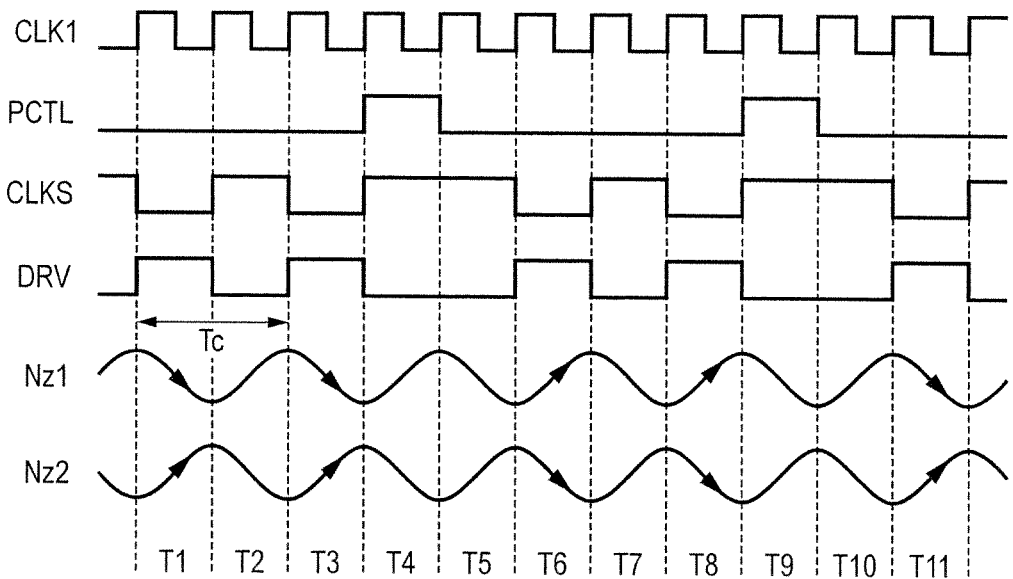
FIG. 3 is a timing chart explaining how the switching circuit operates when the phase shift circuit is activated in the semiconductor device of the first embodiment.

Explained below with reference to FIGS. 2 and 3 is the operation of the phase shift circuit 15 included in the semiconductor device 100 as the first embodiment.

FIG. 2 is a timing chart explaining how the switching circuit 12 operates when the phase shift circuit 15 is deactivated in the semiconductor device 100 of the first embodiment.

FIG. 2 explains the problem encountered with a semiconductor device not equipped with the phase shift circuit 15. In FIG. 2, the horizontal axis represents time periods T1 through T11, and the vertical axis indicates schematically the logic level changes of various signals as well as the waveforms of noises Nz1 and Nz2.

As discussed above, the phase shift circuit 15 has the function of shifting the phase of the first clock CLK1 based on the phase control signal PCTL. In FIG. 2, the first clock CLK1 is an internal clock used by a functional circuit included in the semiconductor device 100. The value of the frequency of the internal clock is higher than that of the operating frequency of the switching circuit 12, so that the phase shift circuit 15 divides the first clock CLK1 to generate the phase shifted clock CLKS. FIG. 2 shows an example in which the first clock CLK1 is divided into one half to generate the phase shifted clock CLKS having a drive cycle Tc.

Because the phase control signal PCTL is set to the Low level (L), the phase shift circuit 15 divides the first clock CLK1 into one half to generate the phase shifted clock CLKS. The switching circuit 12 generates the drive pulse DRV with the drive cycle Tc by inverting the logic level of the phase shifted clock CLKS, and outputs the generated drive pulse DRV to the terminal T. While the drive pulse DRV is being at the High level, the current mirror circuit 11 charges the parasitic capacitances Cs and Cf by way of the switching circuit 12 (see FIG. 1).

The value of the parasitic capacitance Cf between the finger FNG and the touch electrode TP is affected by the electromagnetic waves received by the human body. For example, consider a situation in which the noise varying in synchronism with the drive pulse DRV such as the noise Nz1 or Nz2 is superimposed on the touch electrode TP. This situation can occur when the human body receives the electromagnetic waves of the first clock CLK1 of the semiconductor device 100 or the electromagnetic waves generated by a drive pulse (DRV) generation circuit.

In the time period T1 where the drive pulse DRV is set to the High level, the noise level of the noise Nz1 drops. In this case, the value of the parasitic capacitance Cf apparently increases as compared with when the human body does not receive electromagnetic waves. On the other hand, the noise level of the noise Nz2 rises in the time period T1, so that the parasitic capacitance Cf apparently decreases. The apparent increase in the value of the parasitic capacitance Cf caused by the noise Nz1 or the apparent drop in the value of the parasitic capacitance Cf due to the noise Nz2 can affect the value of the output current I1 from the current mirror circuit 11. Thus it is feared that the presence or absence of touch over the touch electrode TP may be falsely determined.

FIG. 3 is a timing chart explaining how the switching circuit 12 operates when the phase shift circuit 15 is activated in the semiconductor device 100 of the first embodiment.

The timing chart of FIG. 3 differs from that of FIG. 2 in that the logic level of the phase control signal PCTL set to the Low level in FIG. 2 is set to the High level in the time periods T4 and T9 in FIG. 3.

In response to the phase control signal PCTL set to the High level in the time period T4, the phase shift circuit 15 generates the drive pulse DRV in the time period T6 where the phase is shifted by 180 degrees relative to the time period T5. Likewise, in response to the phase control signal PCTL set to the High level in the time period T9, the phase shift circuit 15 generates the drive pulse DRV in the period T11 where the phase is shifted by 180 degrees relative to the time period T10. Thus as shown in FIG. 3, the increase in the output current I1 of the current mirror circuit caused by the noise Nz1 in the time periods T1 and T3 is cancelled out by the decrease in the output current I1 due to the noise Nz1 in the time periods T6 and T8. When the noise Nz2 is superimposed on the touch electrode TP, the phase-shifted drive pulse DRV suppresses likewise the increase and decrease in the output current I1 of the current mirror circuit 11. After the time period T11, the control timing from the time period T1 to the timing period T10 is repeated.

Over the counting period, the counter 14 counts the second clock CLK2 output from the current control oscillation circuit 13 driven with the output current I2 of the current mirror circuit. As a result, the presence or absence of touch is accurately determined even if the noises Nz1 and Nz2 are superimposed on the touch electrode TP.

The effects of the semiconductor device 100 as the first embodiment are explained below. On the basis of the phase control signal PCTL, the phase shift circuit 15 shifts the phase of the drive pulse DRV output to the terminal T from the switching circuit 12. As a result, the number of drive pulses DRV in effect when the noise Nz1 is superimposed on the touch electrode TP coupled to the terminal T causing an increase in the value of the output current I1 from the current mirror circuit 11, and the number of drive pulses DRV in effect when the noise Nz2 is superimposed on the touch electrode TP causing a decrease in the value of the output current I1 approach each other. The fluctuations in the output current I1 caused by the noises Nz1 and Nz2 are thus suppressed.

The beneficial effects of phase control with the drive pulse DRV by the phase shift circuit 15 are prominent when the noise Nz1 or Nz2 synchronized with the drive cycle Tc of the drive pulse DRV is superimposed. The erroneous determination of touch over the touch electrode TP due to noise is thus reduced.

Second Embodiment

Figure 4:
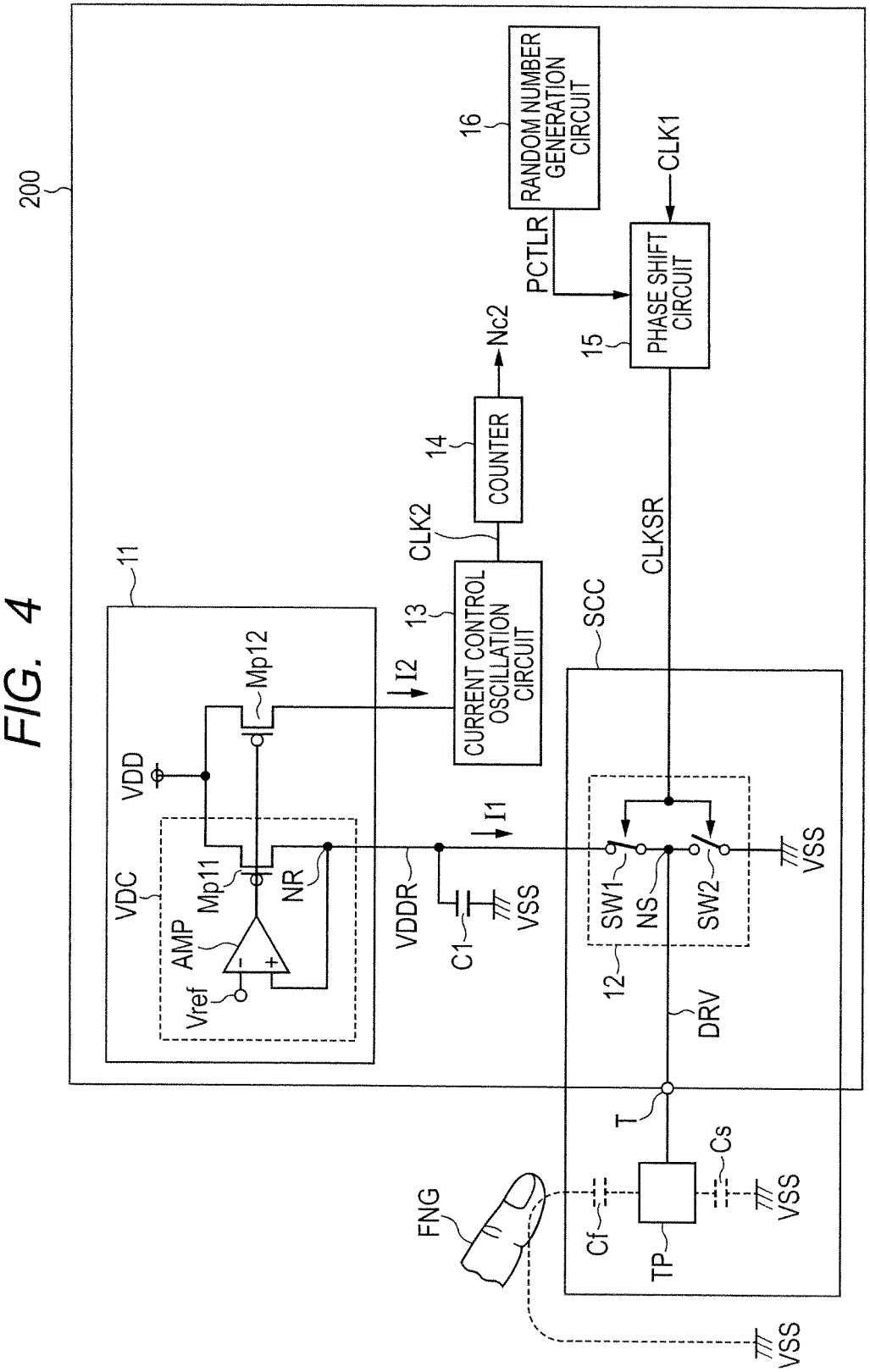
FIG. 4 is a block diagram of a semiconductor device as a second embodiment of the present invention.

FIG. 4 is a block diagram of a semiconductor device 200 as the second embodiment of the present invention.

In FIG. 4, the same reference characters as those in FIG. 1 designate structurally or functionally similar or identical components, and their explanations will be omitted where redundant.

The semiconductor device 200 shown in FIG. 4 corresponds to the structure of the semiconductor device 100 in FIG. 1 supplemented with a random number generation circuit 16. The random number generation circuit 16 randomly generates a phase control signal PCTLR and outputs the generated signal PCTLR to the phase shift circuit 15. For example, a feedback control shift register may be applied to the random number generation circuit 16. The phase shift circuit 15 generates a phase shifted clock CLKSR based on the phase control signal PCTLR.

The operation of the phase shift circuit 15 included in the semiconductor device 200 of the second embodiment is explained below with reference to FIGS. 5 and 6.

Figure 5:
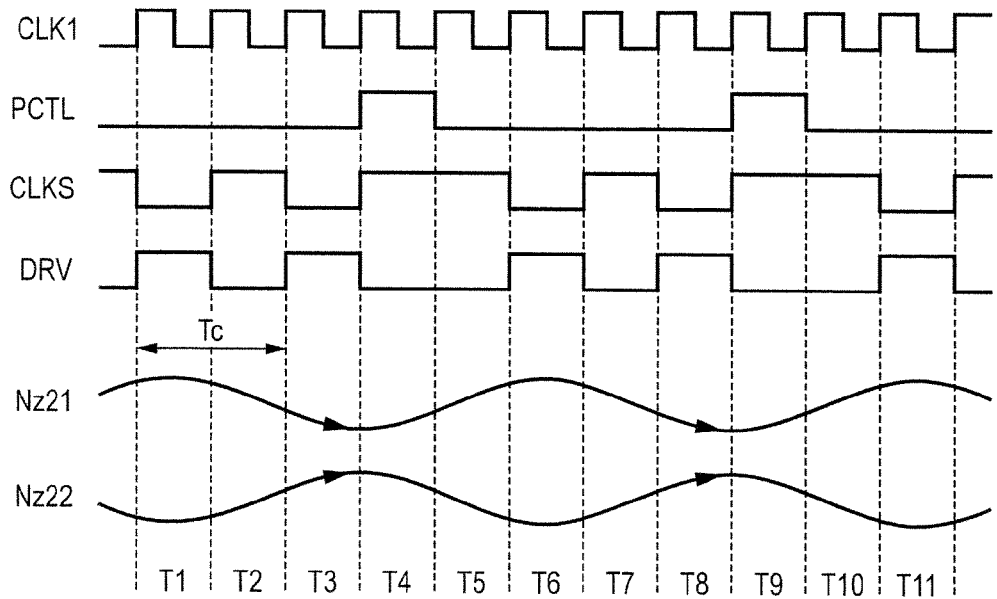
FIG. 5 is a timing chart explaining the problem encountered when a noise having a cycle longer than the drive cycle of a drive pulse is superimposed on the semiconductor device of the first embodiment.

FIG. 5 is a timing chart explaining the problem encountered when a noise having a cycle longer than the drive cycle Tc of the drive pulse DRV is superimposed on the semiconductor device 100 of the first embodiment.

The timing chart of FIG. 5 is obtained when the noises Nz1 and Nz2 in the timing chart of FIG. 3 are replaced with noises Nz21 and Nz22 each having a cycle about 2.5 times as long as the cycle of the noise Nz1 or Nz2. The generation timings of the other signals are the same in both drawings.

As shown in FIG. 5, in response to the phase control signal PCTL generated in the time periods T4 and T9, the drive pulses DRV expected to be generated in the time periods T5 and T10 are shifted to the time periods T6 and T11, respectively. However, if the noise Nz21 with its cycle longer than that of the noise Nz1 is superimposed on the touch electrode TP, there occurs an increase in the value of the output current I1 from the current mirror circuit 11 in the time periods T3 and T8, for example. Likewise, if the noise Nz22 is superimposed on the touch electrode TP, there is a decrease in the value of the output current I1 in the periods T3 and T8.

Figure 6:
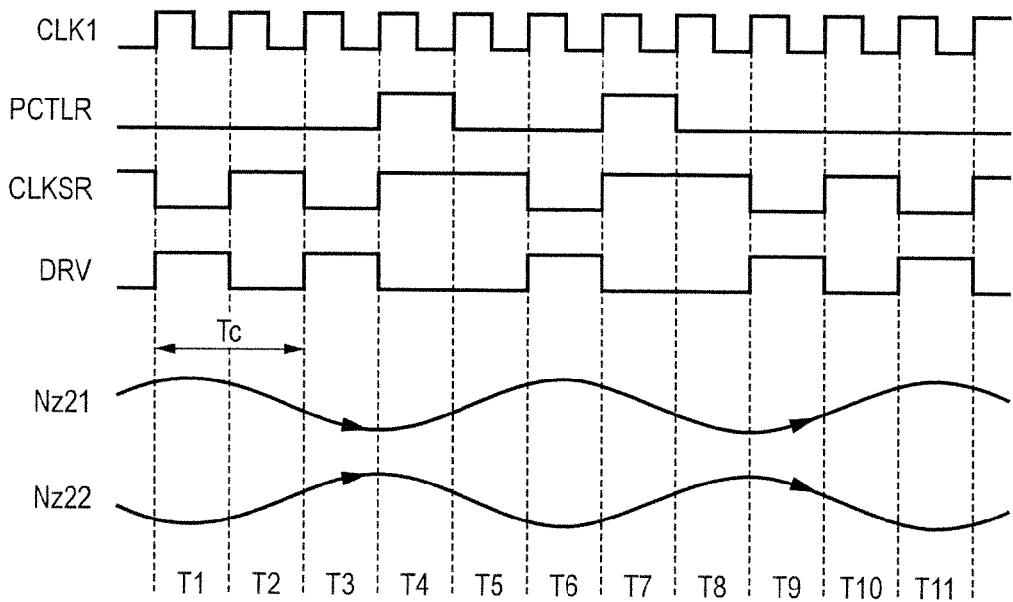
FIG. 6 is a timing chart explaining how the switching circuit included in the semiconductor device of the second embodiment operates.

FIG. 6 is a timing chart explaining how the switching circuit 12 included in the semiconductor device 200 of the second embodiment operates.

In FIG. 5, the phase control signal PCTL is set to the High level in the time periods T4 and T9. In FIG. 6, the phase control signal PCTLR is set to the High level in the time periods T4 and T7. As a result, the fluctuations in the noise level of the noises Nz21 and Nz22 are generated in a manner being cancelled out in the time periods T3 and T9. When the phase control signal PCTLR is randomly generated over the counting period of the counter 14, the number of drive pulses DRV in effect when the noise Nz21 is superimposed on the touch electrode TP causing an increase in the value of the output current I1 from the current mirror circuit 11, and the number of drive pulses DRV in effect when the noise Nz22 is superimposed on the touch electrode TP causing a decrease in the value of the output current I1 approach each other. The fluctuations in the output current I1 caused by the noises Nz21 and Nz22 are thus suppressed.

The effects of the semiconductor device 200 as the second embodiment are explained below. When the random number generation circuit 16 generates the phase control signal PCTLR with regard to the noises varying in cycles longer than the drive cycle Tc of the drive pulse DRV, it is possible to improve the fluctuations in the value of the output current I1 of the current mirror circuit 11 caused by the noises. Furthermore, when a feedback control shift register is applied to the random number generation circuit 16, a definite probability is guaranteed for random number generation so that the average switched capacitor frequency can be made constant.

Third Embodiment

Figure 7:
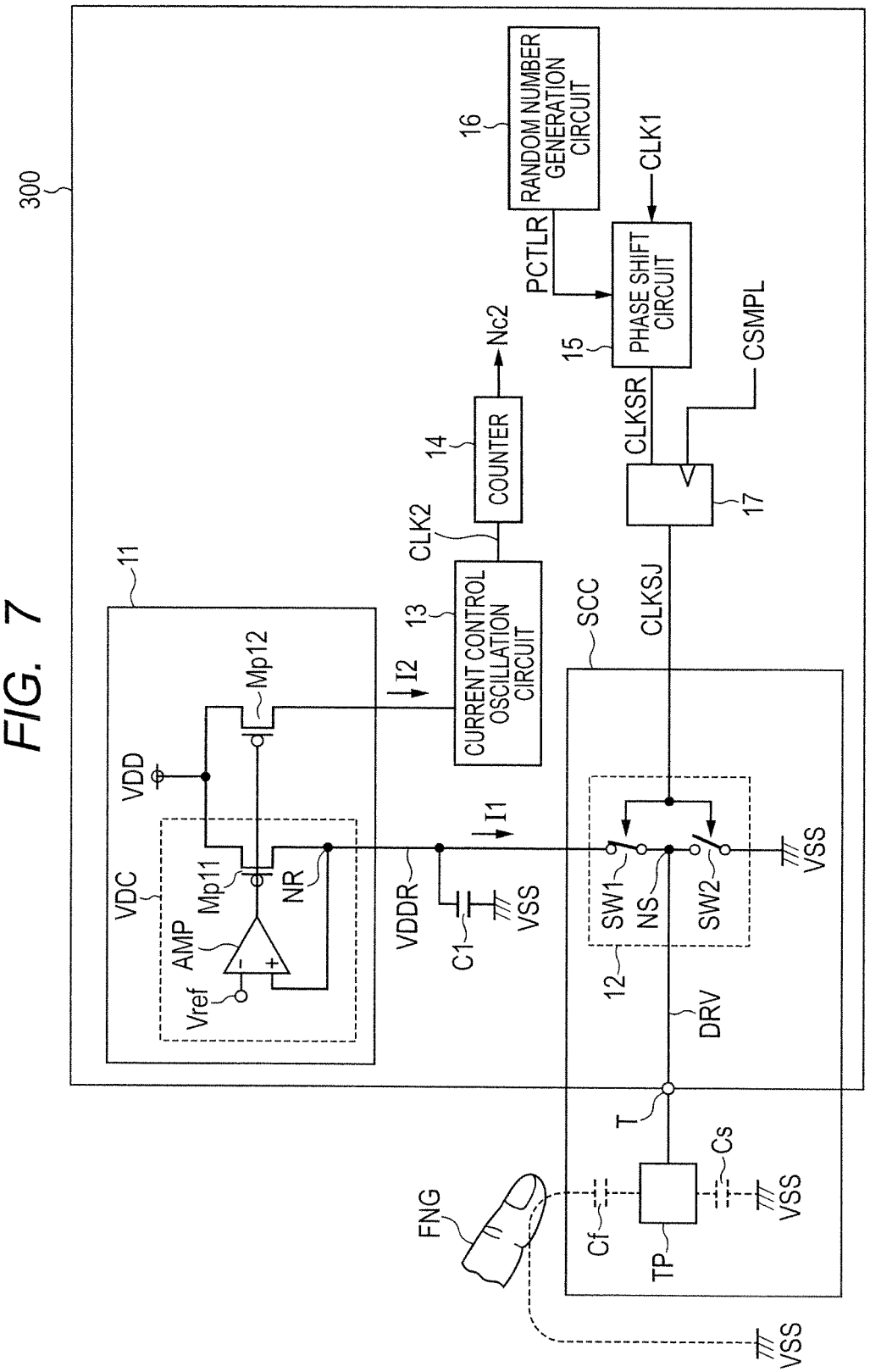
FIG. 7 is a block diagram of a semiconductor device as a third embodiment of the present invention.

FIG. 7 is a block diagram of a semiconductor device 300 as the third embodiment of the present invention.

In FIG. 7, the same reference characters as those in FIG. 4 designate structurally or functionally similar or identical components, and their explanations will be omitted where redundant.

The semiconductor device 300 shown in FIG. 7 corresponds to the structure of the semiconductor device 200 in FIG. 4 supplemented with a jitter addition circuit 17. The jitter addition circuit 17 may be a flip-flop, for example. The phase shifted clock CLKSR output from the phase shift circuit 15 and a sampling clock CSMPL are input to the data terminal and clock terminal of the jitter addition circuit 17 (flip-flop), respectively. The jitter addition circuit 17 captures the data of the phase shifted clock CLKSR at rising edges of the sampling clock CSMPL, and outputs the captured data as a phase shifted clock CLKSJ to the switching circuit 12.

Figure 8:
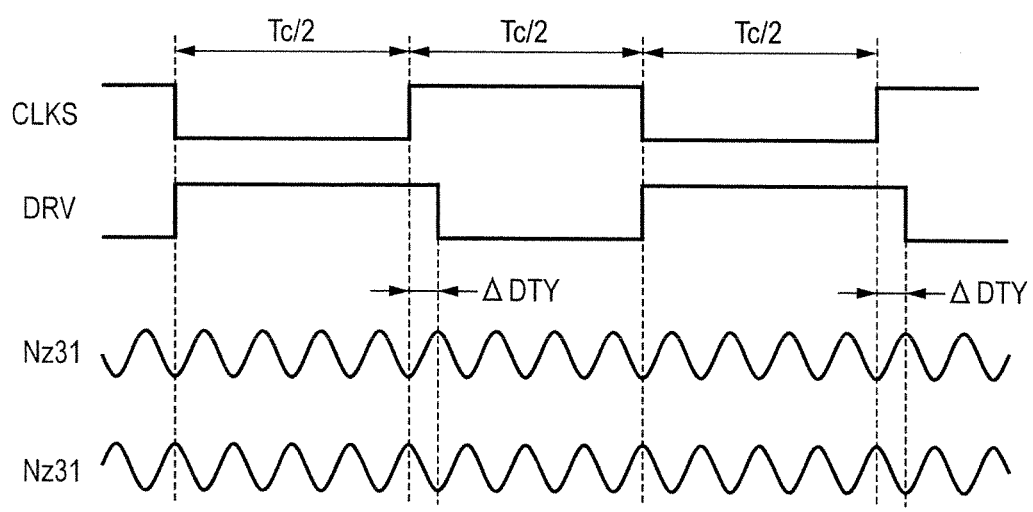
FIG. 8 is a timing chart explaining the problem encountered when a noise having a higher-order even-multiple frequency is superimposed on a touch electrode in the semiconductor device of the first embodiment.

FIG. 8 is a timing chart explaining the problem encountered when a noise having a higher-order even-multiple frequency is superimposed on the touch electrode TP in the semiconductor device 100 of the first embodiment.

In FIG. 8, the phase shifted clock CLKS (see FIG. 1) output from the phase shift circuit 15 has Low-level and High-level time periods with a Tc/2 cycle relative to the drive cycle Tc. In the switching circuit 12 to which the phase shifted clock CLKS is input, the switches SW1 and SW2 are prevented from going on simultaneously, and there is a discrepancy in drive capability between the switches SW1 and SW2. For these reasons, the duty ratio of the drive pulse DRV incurs a divergence relative to 50 percent. FIG. 8 shows the case where the High-level time period of the drive pulse DRV is longer than its Low-level time period by a duty error time ΔDTY.

When a noise Nz31 having a higher-order even-multiple frequency is superimposed on the touch electrode TP, there may occur an increase in the level of the noise Nz31 during the duty error time ΔDTY. There may also occur a decrease in the level of a noise Nz32. A rising waveform of the noise Nz31 during the duty error time ΔDTY lowers the value of the output current I1 from the current mirror circuit 11. On the other hand, a falling waveform of the noise Nz32 during the duty error time ΔDTY raises the value of the output current I1 from the current mirror circuit 11. Each of these cases can be the cause of the erroneous determination of touch on the touch electrode TP.

Figure 9:
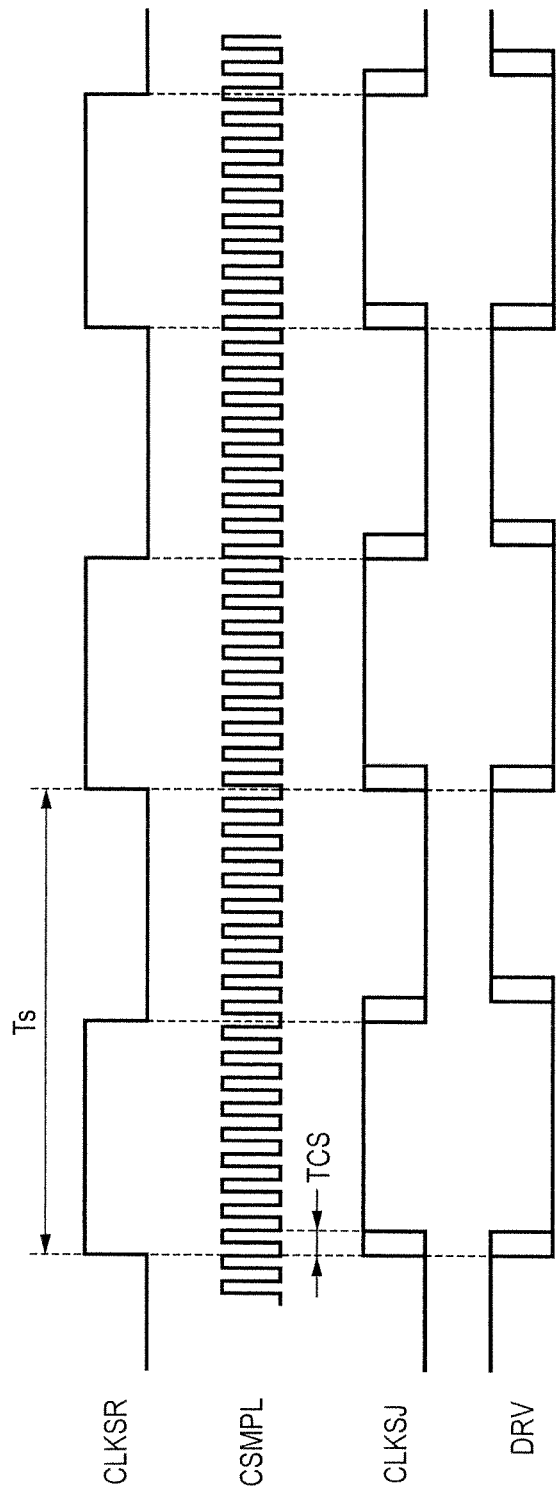
FIG. 9 is a timing chart explaining how a jitter addition circuit included in the semiconductor device of the third embodiment operates.

FIG. 9 is a timing chart explaining how the jitter addition circuit 17 included in the semiconductor device 300 of the third embodiment operates.

The phase shift circuit 15 (see FIG. 7) generates the phase shifted clock CLKSR having a cycle Ts. In some cycles, the phase shifted clock CLKSR is not generated in response to the phase control signal PCTLR output from the random number generation circuit 16. For convenience of explanation, FIG. 9 shows the cycles in which the phase shifted clock CLKSR is continuously generated.

The cycle TCS of the sampling clock CSMPL is set to be shorter than one-half of the cycle Ts of the phase shifted clock CLKSR in accordance with the sampling theorem. The jitter addition circuit 17 captures the phase shifted clock CLKSR with the sampling clock CSMPL to generate the drive pulse DRV. Because the sampling clock CSMPL is generated asynchronously with the phase shifted clock CLKSR, the rising and falling edges of the drive pulse DRV fluctuate within the cycle TCS of the sampling clock CSMPL.

Thus the timing of the rising or falling edges of the noise Nz31 in the duty error time ΔDTY varies with each drive pulse DRV. The same applies to the noise Nz32 as well. As a result, the fluctuations in the output current I1 of the current mirror circuit 11 caused by the noise Nz31 or Nz32 are suppressed, so that the erroneous determination of touch on the touch electrode TP is reduced.

Because the phase shifted clock CLKSR input to the flip-flop is captured with the sampling clock CSMPL, jitter can be generated in the drive pulse DRV without affecting the basic frequency of the drive pulse DRV. As a result, it is possible to generate jitter in the drive pulse DRV without affecting the operation of the switched capacitor circuit SCC.

In the foregoing description, the drive pulse DRV was shown to be generated during the period where the phase is not shifted by the phase shifted clock CLKSR. The jitter addition circuit 17 can add jitter within the cycle TCS to the drive pulse DRV phase-shifted by the phase shifted clock CLKSR. Furthermore, whereas FIG. 7 shows the structure in which the generation of the phase shifted clock CLKSR by the phase shift circuit 15 is controlled using the phase control signal PCTLR output from the random number generation circuit 16, it will be readily appreciated that the formation of jitter in the drive pulse DRV by the jitter addition circuit 17 may also be applied to a structure without the random number generation circuit 16.

Fourth Embodiment

Figure 10:
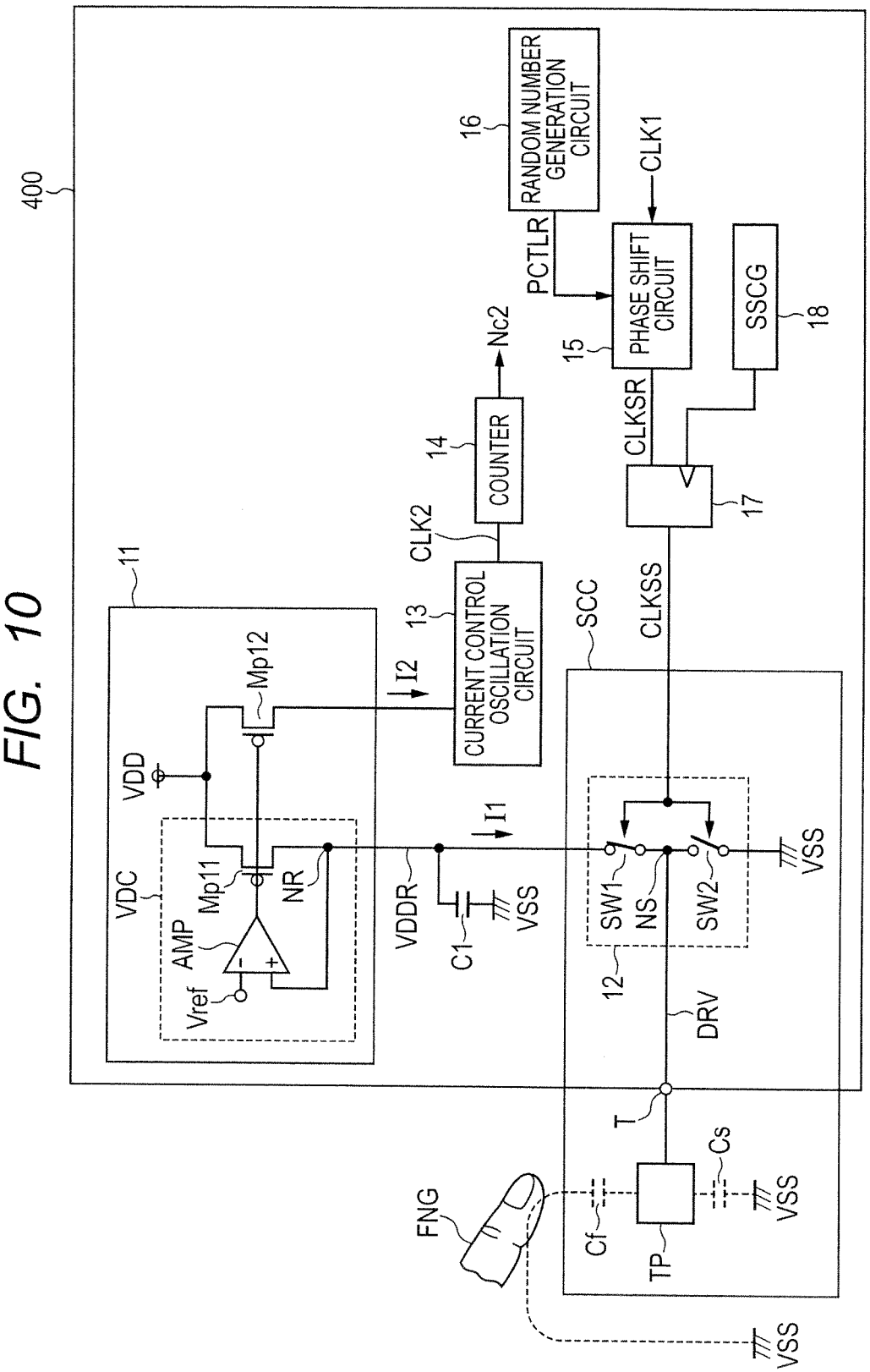
FIG. 10 is a block diagram of a semiconductor device as a fourth embodiment of the present invention.

FIG. 10 is a block diagram of a semiconductor device 400 as the fourth embodiment of the present invention.

In FIG. 10, the same reference characters as those in FIG. 7 designate structurally or functionally similar or identical components, and their explanations will be omitted where redundant.

The semiconductor device 400 shown in FIG. 10 has a structure in which the sampling clock CSMPL applied to the jitter addition circuit 17 in the semiconductor device 300 of FIG. 7 is generated by a spread spectrum clock generator SSCG. The changed structure entails changing the name of the signal output from the jitter addition circuit 17 to a phase shifted clock CLKSS.

When the spread spectrum clock generator SSCG is used to generate the sampling clock CSMPL, it is possible to generate more precisely the jitter to be added to the drive pulse DRV. It is also possible to generate the jitter in the drive pulse DRV without affecting the basic frequency of the drive pulse DRV.

It is to be understood that while the present invention has been described in conjunction with specific embodiments, they are only for exemplary purposes and not limitative of this invention. It is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A semiconductor device comprising:
a terminal to which a touch electrode may be coupled;
a source voltage drop circuit which generates a constant voltage;
a phase shift circuit which generates a phase shifted clock in response to a first clock and a phase control signal; and
a switching circuit to which the constant voltage is supplied;
wherein the switching circuit generates a drive pulse for applying the constant voltage to the terminal in response to the phase shifted clock, and
wherein the phase shift circuit varies the phase of the drive pulse based on the phase control signal.

2. The semiconductor device according to claim 1, further comprising:
a current control oscillation circuit; and
a counter;
wherein the source voltage drop circuit supplies a first current to the switching circuit;
wherein the current control oscillation circuit generates a second clock of which the frequency varies depending on the value of the first current;
wherein the counter counts the number of pulses in the second clock over a counting period, and
wherein the phase shift circuit varies the phase of the drive pulse in such a manner that the number of the drive pulses in effect when a noise superimposed on the touch electrode causes an increase in the value of the first current and the number of the drive pulses in effect when a noise superimposed on the touch electrode causes a decrease in the value of the first current approach each other.

3. The semiconductor device according to claim 2, further comprising a random number generation circuit which randomly generates the phase control signal.

4. The semiconductor device according to claim 2, further comprising a jitter addition circuit,
wherein the jitter addition circuit adds jitter to the phase shifted clock based on a sampling clock asynchronous with the phase shifted clock.

5. The semiconductor device according to claim 4, further comprising a spread spectrum clock generator which generates the sampling clock.

* * * * *